US012730301B2

(12) United States Patent
Taira

(10) Patent No.: US 12,730,301 B2
(45) Date of Patent: Sep. 8, 2026

(54) MOVABLE DEVICE, MEMS DEVICE AND OPTICAL SCANNING APPARATUS

(71) Applicant: Tomohiro Taira, Tokyo (JP)

(72) Inventor: Tomohiro Taira, Tokyo (JP)

(73) Assignee: MITSUMI ELECTRIC CO., LTD., Tokyo (JP)

( * ) Notice: Subject to any disclaimer, the term of this patent is extended or adjusted under 35 U.S.C. 154(b) by 501 days.

(21) Appl. No.: 18/341,131

(22) Filed: Jun. 26, 2023

(65) Prior Publication Data

US 2024/0004185 A1 Jan. 4, 2024

(30) Foreign Application Priority Data

Jun. 30, 2022 (JP) ................................ 2022-106664

(51) Int. Cl.
*G02B 26/08* (2006.01)
*B81B 3/00* (2006.01)
*B81C 99/00* (2010.01)

(52) U.S. Cl.
CPC .......... *G02B 26/0858* (2013.01); *B81B 3/007* (2013.01); *B81C 99/005* (2013.01); *B81B 2201/042* (2013.01); *B81B 2203/04* (2013.01)

(58) Field of Classification Search
CPC ........... G02B 26/0858; G02B 26/0841; G02B 26/101; G02B 26/105; B81B 3/007; B81B 2201/042; B81B 2203/04; B81B 3/0021; B81B 7/02; B81C 99/005; B81C 99/004; H04N 3/08
See application file for complete search history.

(56) References Cited

U.S. PATENT DOCUMENTS

| | | | | |
|---|---|---|---|---|
| 2005/0179452 A1* | 8/2005 | Brunner | ................. | G09G 3/006 324/750.25 |
| 2013/0208330 A1* | 8/2013 | Naono | ................... | G02B 26/10 359/200.1 |
| 2020/0201030 A1 | 6/2020 | Sudo | | |
| 2021/0036592 A1 | 2/2021 | Suzuki et al. | | |

FOREIGN PATENT DOCUMENTS

| | | | | |
|---|---|---|---|---|
| JP | 2008294127 A * | 12/2008 | ............. | H01L 24/06 |
| JP | 2012030342 A * | 2/2012 | ............. | H01L 24/06 |
| JP | 2012-051062 | 3/2012 | | |
| JP | 6546370 | 7/2019 | | |
| JP | 2020-101761 | 7/2020 | | |

OTHER PUBLICATIONS

English translation of JP-2008294127-A (Year: 2008).*
English translation of JP-2012030342-A (Year: 2012).*
Office Action mailed on Nov. 18, 2025 with respect to the corresponding Japanese patent application No. 2022-106664.
Office Action mailed on Mar. 10, 2026 with respect to the corresponding Japanese patent application No. 2022-106664.

* cited by examiner

*Primary Examiner* — Tulsidas C Patel
*Assistant Examiner* — Joshua Kiel M Rodriguez
(74) *Attorney, Agent, or Firm* — IPUSA, PLLC

(57) ABSTRACT

A movable device includes a movable portion and a drive structure configured to drive the movable portion. The movable device includes a support frame that surrounds the movable portion and supports the drive structure. The movable device includes electrodes electrically coupled to the drive structure. The movable device includes pseudo electrodes electrically isolated from the drive structure. The electrodes and the pseudo electrodes are provided on the support frame.

15 Claims, 7 Drawing Sheets

100
110
111
112
113A
114A
SA
132B
153B
155B
156A
154A
131A
131B
115
152A
151B
142A
144A
158A
140
O
144B
142B
157B
141A
141B
157A
158B
151A
143A
143B
152B
120
122A
121A
122B
121B
155A
153A
113B
114B
132A
154B
156B
131A,131B,132A,132B
130
151A,151B,152A,152B,153A,153B,154A,154B,
155A,155B,156A,156B,157A,157B,158A,158B
150
X
Y
Z

W 100C 130C 150C
100D 150D 130D
100E 130E 150E
100B 130B 150B
150A 130A 140A 100A
130F 100F 150F
100I 150I 130I
150H 130H 100H
150G 130G 100G

EXAMPLE 1
131A
100B
203A
100I
100C
132B
132A
204A
100H
100A
100D
204B
100G
100E
131B
100F
EXAMPLE 2
100B
203B
100I
100C
204D
204A
100H
100A
100D
204B
204C
100G
100E
100F
EXAMPLE 3
130I
130B
100B
204E
203C
130C
100I
100C
204K
204I
130H
204D
130D
204A
100H
100A
100D
204B
204H
204C
204G
204J
204L
100G
100E
130G
130F
100F
204F
130E
Y
X
Z

CHARGE CAPACITY C [F]
P0
P3
P1
PC
P2
FA
FC
F3
F0
F2
F1
FREQUENCY F [Hz]
: REFERENCE EXAMPLE (AFTER ASSEMBLY)
: COMPARATIVE EXAMPLE (WITHOUT USING PSEUDO ELECTRODE)
: EXAMPLE 1
: EXAMPLE 2
: EXAMPLE 3

MOVABLE DEVICE, MEMS DEVICE AND OPTICAL SCANNING APPARATUS

CROSS-REFERENCE TO RELATED APPLICATIONS

This application claims priority under 35 U.S.C. § 119 to Japanese Patent Application No. 2022-106664, filed Jun. 30, 2022, the contents of which are incorporated herein by reference in their entirety.

BACKGROUND

1. Field of the Invention

The present disclosure relates to a movable device, a microelectromechanical systems (MEMS) device, and an optical scanning apparatus.

2. Description of the Related Art

Movable devices have been known to drive movable portions with electricity. Some movable devices include MEMS devices that are formed by microfabrication techniques. The movable devices are also known to be included in optical scanning apparatuses that perform scanning with light.

During testing of the movable device, probes are brought into contact with electrodes of the movable device. The electrodes are provided on one side of the movable device (for example, Patent Document 1).

RELATED-ART DOCUMENT

Patent Document

[Patent Document 1] Japanese Unexamined Patent Application Publication No. 2012-51062

In the testing of the movable device described in Patent Document 1, none of the probe contacts the movable device successfully due to oscillations during operation of the movable device, and thus testing results may not be obtained appropriately. For this reason, the testing is performed after the movable device is assembled into a package, and thus testing hours, the number of components, or the like may be increased. As a result, greater manufacturing costs may be incurred.

SUMMARY

A movable device in one aspect of the present disclosure includes a movable portion and a drive structure configured to drive the movable portion. The movable device includes a support frame that surrounds the movable portion and supports the drive structure. The movable device includes electrodes electrically coupled to the drive structure. The movable device includes pseudo electrodes electrically isolated from the drive structure. The electrodes and the pseudo electrodes are provided on the support frame.

DESCRIPTION OF THE EMBODIMENTS

Figure 1:
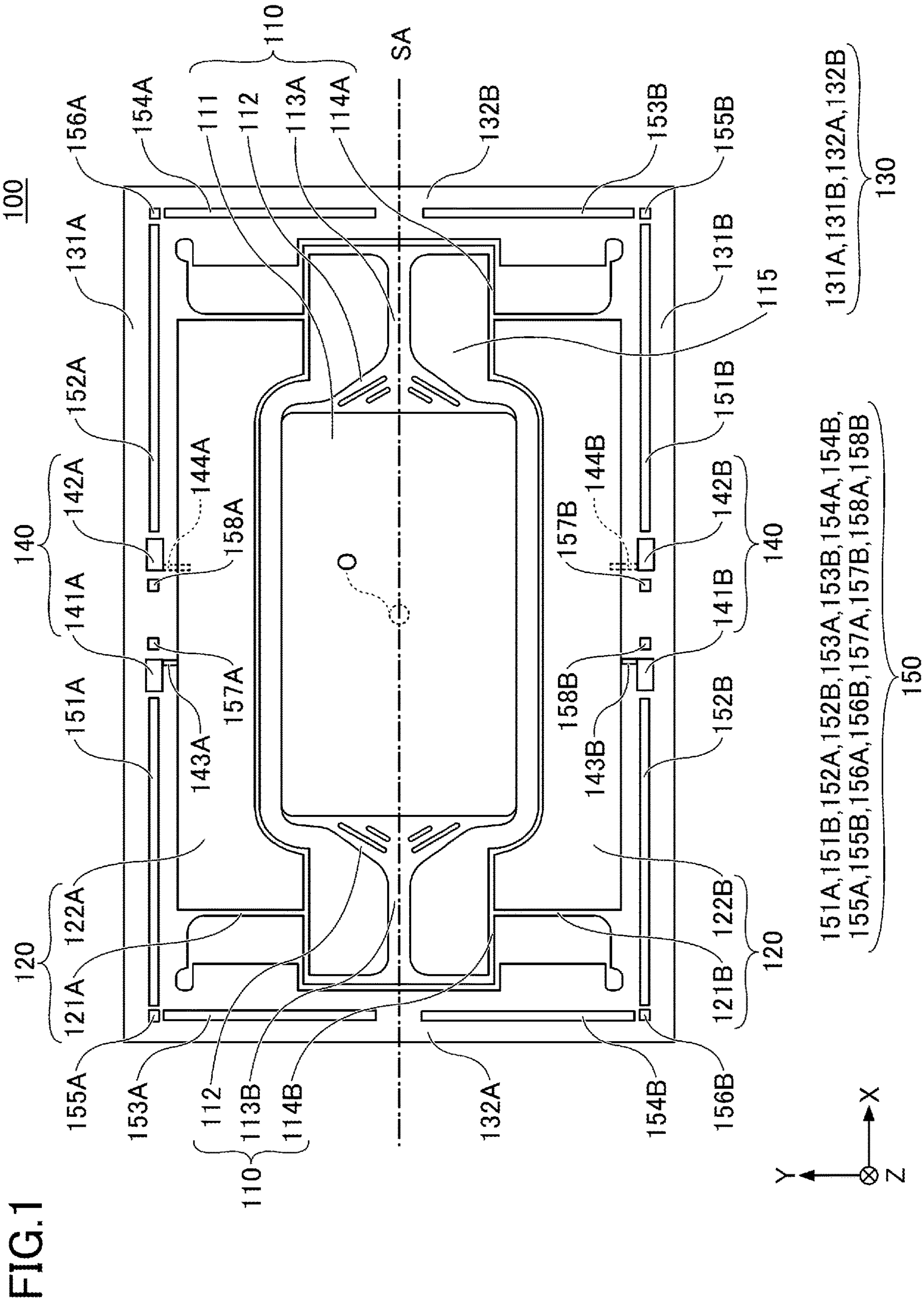
FIG. 1 is a diagram illustrating a configuration example of a movable device according to one embodiment.

One or more embodiments of the present disclosure will be described in detail with reference to the drawings. In the drawings, the same components are denoted by the same numerals, and redundant description thereof is omitted as appropriate.

In each drawing, orthogonal coordinates in which an X-axis, a Y-axis, and a Z-axis are used are defined as directional representations. An X-axis direction refers to a left-right direction, a Y-axis direction refers to a front-rear direction, and a Z-axis direction refers to an up-down direction. However, these directional representations are not intended to limit the directions in the embodiments described below.

The configuration of a movable device 100 according to one embodiment will be described below.

<Configuration of Movable Device>

FIG. 1 is a diagram illustrating a configuration example of the movable device 100 according to the present embodiment. The movable device 100 is a MEMS device that is formed by microfabrication techniques, and is a MEMS mirror, for example.

The movable device 100 includes a movable portion 110, a drive portion 120, a support frame 130, electrodes 140, and pseudo electrodes 150.

The movable portion 110 is a movable body that is driven by the drive portion 120, and is a mirror body, for example. A through-hole 115 penetrating in the Z-axis direction (vertical direction) is provided around the movable portion 110.

The movable portion 110 includes a mirror 111, a mirror support 112, torsion beams 113A and 113B, and coupling beams 114A and 114B.

The drive portion 120 is a drive source that drives the movable portion 110. The drive portion 120 drives the movable portion 110 by piezoelectric driving, but may drive the movable portion 110 by electromagnetic driving or electrostatic driving.

The drive portion 120 includes drive beams 121A and 121B and drive sources 122A and 122B.

A support frame 130 surrounds the perimeter of the movable portion 110. The support frame 130 supports the drive portion 120. The shape of the support frame 130 is, for example, a rectangle.

The support frame 130 includes frames 131A, 131B, 132A, and 132B that define respective four sides of the rectangle.

The electrodes 140 are conductors that are electrically coupled to the drive portion 120. The electrodes 140 are supported at the support frame 130.

The electrodes 140 include upper electrodes 143A and 143B, lower electrodes 144A and 144B, and electrode pads 141A, 141B, 142A, and 142B.

The pseudo electrodes 150 are pseudo conductors that are electrically isolated from the drive portion 120. The pseudo electrodes 150 are supported at the support frame 130.

The pseudo electrodes 150 include pseudo electrode pads 151A, 151B, 152A, 152B, 153A, 153B, 154A, 154B, 155A, 155B, 156A, 156B, 157A, 157B, 158A, and 158B.

The electrode pads 141A to 142B are arranged symmetrically with respect to the center O of the support frame 130, in a plan view. The electrode pads 141A and 142A are provided on a first frame 131A that defines one side of the support frame 130, and the electrode pads 141B and 142B are provided on a second frame 131B that defines the other side of the support frame 130 facing the one side. The plan view refers to a view of the movable device 100 that is viewed from the Z-axis direction (from directly above).

Given two of the pseudo electrode pads 151A to 158B are arranged symmetrically with respect to the center O of the support frame 130, in the plan view. The pseudo electrode pads 151A to 154B are each provided on a corresponding one frame among the frames 131A to 132B that define the respective four sides of the support frame 130, and the frames 131A to 132B surround the movable portion 110.

The pseudo electrode pads 155A to 156B may be provided at respective four corners of the support frame 130, each of which is formed at a junction between one end portions of adjacent frames among the frames 131A to 132B.

The pseudo electrode pads 157A and 158A may be provided at a middle portion of the first frame 131A, and the pseudo electrode pads 157B and 158B may be provided at a middle portion of the second frame 131B. The first frame 131A defines one side of the support frame 130, and the second frame 131B defines the other side of the support frame 130 facing the one side.

The electrode pads 141A to 142B and the pseudo electrode pads 151A to 158B are arranged at locations where one or more probes are in contact with each of these electrode pads during testing of the movable device 100 described below.

The mirror 111 is formed on the upper surface of the mirror support 112.

The mirror support 112 supports the mirror 111. The torsion beams 113A and 113B are coupled to respective ends of the mirror support 112 in the X-axis direction (left-right direction).

The torsion beams 113A and 113B extend in the X-axis direction (left-right direction). The torsion beams 113A and 113B support the mirror support 112 when viewed from both sides of the mirror support 112. The torsion beams 113A and 113B define a rotation axis SA of the mirror 111.

Upon twisting the torsion beams 113A and 113B, the mirror 111 oscillates about the rotation axis SA. The torsion beams 113A and 113B are respectively coupled to the coupling beams 114A and 114B.

Each of the coupling beams 114A and 114B has, for example, a C-shape in the plan view. The torsion beams 113A and 113B are coupled, at respective ends, to middle portions of the C-shaped coupling beams 114A and 114B. Each of the coupling beams 114A and 114B couples a corresponding torsion beam among the torsion beams 113A and 113B, to the drive beams 121A and 121B.

The drive beams 121A and 121B are coupled to the respective ends of each of the C-shaped coupling beams 114A and 114B.

The drive beams 121A and 121B are provided to make a pair such that the mirror 111 is interposed between the drive beams 121A and 121B, in a direction (Y-axis) perpendicular to the rotation axis SA. The drive beams 121A and 121B are coupled, at respective ends, to the frames 131A and 131B of the support frame 130. The drive sources 122A and 122B are respectively provided on sides where the drive beams 121A and 121B are situated.

Each of the drive sources 122A and 122B is, for example, a piezoelectric element (piezoelectric thin film). Upper electrodes 143A and 143B and lower electrodes 144A and 144B are provided on the drive sources 122A and 122B, respectively.

The upper electrodes 143A and 143B are coupled to the electrode pads 141A and 141B, respectively. The lower electrodes 144A and 144B are coupled to the electrode pads 142A and 142B, respectively.

The first drive source 122A expands or contracts in accordance with a drive voltage that is applied between the electrode pad 141A and the electrode pad 142A (which are also referred to as a first electrode pad 141A and a second electrode pad 142A, respectively). The second drive source 122B expands or contracts in accordance with a drive voltage that is applied between the electrode pad 141B and the electrode pad 142B (which are also referred to as a third electrode pad 142A and a fourth electrode pad 142B, respectively).

In response to an expanding or contracting operation of the first drive source 122A, each first drive beam 121A oscillates in the Z-axis direction (vertical direction). In response to the expanding or contracting operation of the second drive source 122B, each second drive beam 121B oscillates in the Z-axis direction (vertical direction).

Upon alternately applying drive voltages of which polarities are reversed between the first drive source 122A and the second drive source 122B, the first drive beams 121A and the second drive beams 121B alternately oscillate in the opposite Z-axis directions (vertical directions). The first drive beams 121A are disposed on one side of the mirror 111 opposite the other side where the second drive beams 121B are situated.

In response to alternate oscillations of the first drive beams 121A and the second drive beams 121B, the mirror 111 oscillates about the same axis as the rotation axis SA that is defined by the torsion beams 113A and 113B.

The first drive beams 121A are supported by the first frame 131A. The second drive beams 121B are supported by the second frame 131B.

The first frame 131A is coupled, at respective two ends, to ends of the third frame 132A and the fourth frame 132B so as to be perpendicular to the third frame 132A and the fourth frame 132B. The second frame 131B is coupled, at respective two ends, to the other ends of the third frame 132A and the fourth frame 132B so as to be perpendicular to the third frame 132A and the fourth frame 132B.

The first electrode pad 141A and the fourth electrode pad 142B are point-symmetrical with respect to the center O of the support frame 130 in the plan view.

The second electrode pad 142A and the third electrode pad 141B are point-symmetrical with respect to the center O of the support frame 130 in the plan view.

The pseudo electrode pads 151A, 151B, 152A, 152B, 153A, 153B, 154A, and 154B that are linear allow for an increased area of contact with probes.

The pseudo electrode pads 155A, 155B, 156A, 156B, 157A, 157B, 158A, and 158B each of which has a dot shape allow for placement of pads at locations where it is difficult to secure space. The dot shape is approximately square, but may be a circle or the like.

First to fourth pseudo electrode pads, i.e., the pseudo electrode pad 151A, the pseudo electrode pad 151B, the pseudo electrode pad 152A, and the pseudo electrode pad 152B, are each provided on a corresponding frame among the first frame 131A and the second frame 131B facing the first frame 131A of the support frame 130.

The first pseudo electrode pad 151A and the second pseudo electrode pad 151B are point-symmetrical with respect to the center O of the support frame 130, in the plan view. The third pseudo electrode pad 152A and the fourth pseudo electrode pad 152B are point-symmetrical with respect to the center O of the support frame 130, in the plan view.

Fifth to eighth pseudo electrode pads, i.e., the pseudo electrode pad 153A, the pseudo electrode pad 153B, the pseudo electrode pad 154A, and the pseudo electrode pad 154B, are each provided on a corresponding frame among the third frame 132A and the fourth frame 132B facing the third frame 132A of the support frame 130.

The fifth pseudo electrode pad 153A and the sixth pseudo electrode pad 153B are point-symmetrical with respect to the center O of the support frame 130, in the plan view. The seventh pseudo electrode pad 154A and the eighth pseudo electrode pad 154B are point-symmetrical with respect to the center O of the support frame 130, in the plan view.

Ninth to twelfth pseudo electrode pads, i.e., the pseudo electrode pad 155A, the pseudo electrode pad 155B, the pseudo electrode pad 156A, and the pseudo electrode pad 156B, are provided at the respective corners of the support frame 130 each of which is formed at a junction between ends of adjacent frames among the frames 131A, 131B, 132A, and 132B of the support frame 130.

The ninth pseudo electrode pad 155A and the tenth pseudo electrode pad 155B are point-symmetrical with respect to the center O of the support frame 130, in the plan view. The eleventh pseudo electrode pad 156A and the twelfth pseudo electrode pad 156B are point-symmetrical with respect to the center O of the support frame 130, in the plan view.

The thirteenth pseudo electrode pad 157A and the sixteenth pseudo electrode pad 158A are provided at a middle portion of the first frame 131A that defines one side of the support frame 130. The fifteenth pseudo electrode pad 158A and the fourteenth pseudo electrode pad 157B are provided at a middle portion of the second frame 131B that defines the other side facing the one side of the support frame 130.

The thirteenth pseudo electrode pad 157A and the sixteenth pseudo electrode pad 158A are provided between the first electrode pad 141A and the second electrode pad 142A. The fourteenth pseudo electrode pad 157B and the sixteenth pseudo electrode pad 158B are provided between the third electrode pad 141B and the fourth electrode pad 142B.

The thirteenth pseudo electrode pad 157A and the fourteenth pseudo electrode pad 157B are point-symmetrical with respect to the center O of the support frame 130. The fifteenth pseudo electrode pad 158A and the sixteenth pseudo electrode pad 158B are point-symmetrical with respect to the center O of the support frame 130.

As described above, corresponding two electrode pads among the pseudo electrode pads 151A to 158B are symmetrical with respect to the center O of the support frame 130, in the plan view. With this arrangement, the movable device 100 is further fixed in place through one or more probes during testing of the movable device 100, and fluttering of the support frame 130 due to oscillations during operation can be reduced.

The movable device 100 may include any one of a set of the linear pseudo electrode pads 151A to 154B and a set of the dot shaped pseudo electrode pads 155A to 158B.

The third frame 132A and the fourth frame 132B facing the third frame 132A do not support the drive portion 120, and thus oscillations of the drive portion 120 are less likely to be transmitted. With this arrangement, in the movable device 100, the pseudo electrode pads 151A to 152B may be each provided on a corresponding frame among the first frame 131A and the second frame 131B that support the drive portion 120.

Further, in the movable device 100, the pseudo electrode pads 153A to 154B may be provided at the four corners of the support frame 130 each of which is formed at a junction only between end portions of adjacent frames among the frames 131A to 132B.

<Method for Testing Movable Device>

Figure 2:
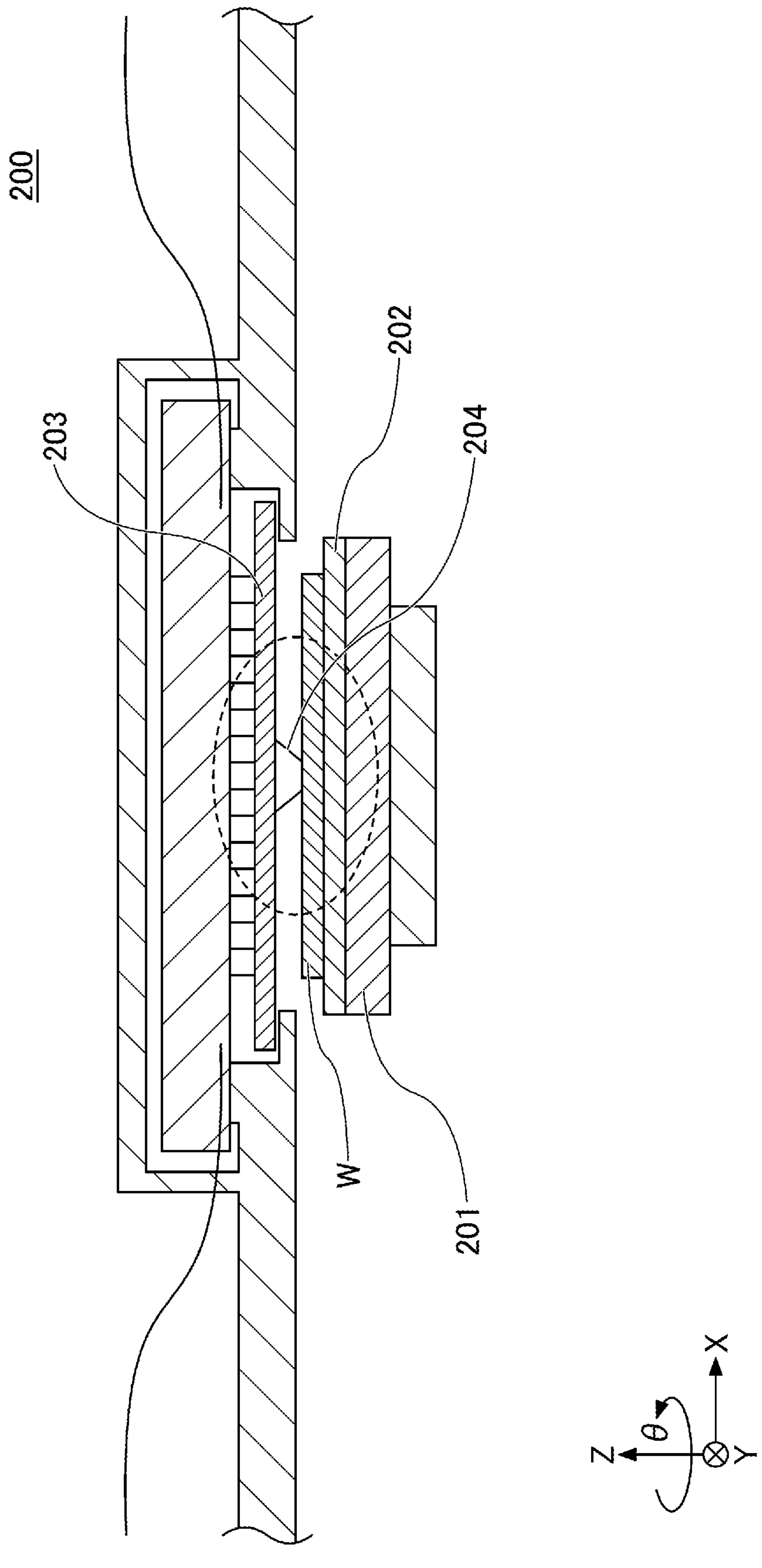
FIG. 2 is a partial cross-sectional view of a testing apparatus according to one embodiment.
Figure 3:
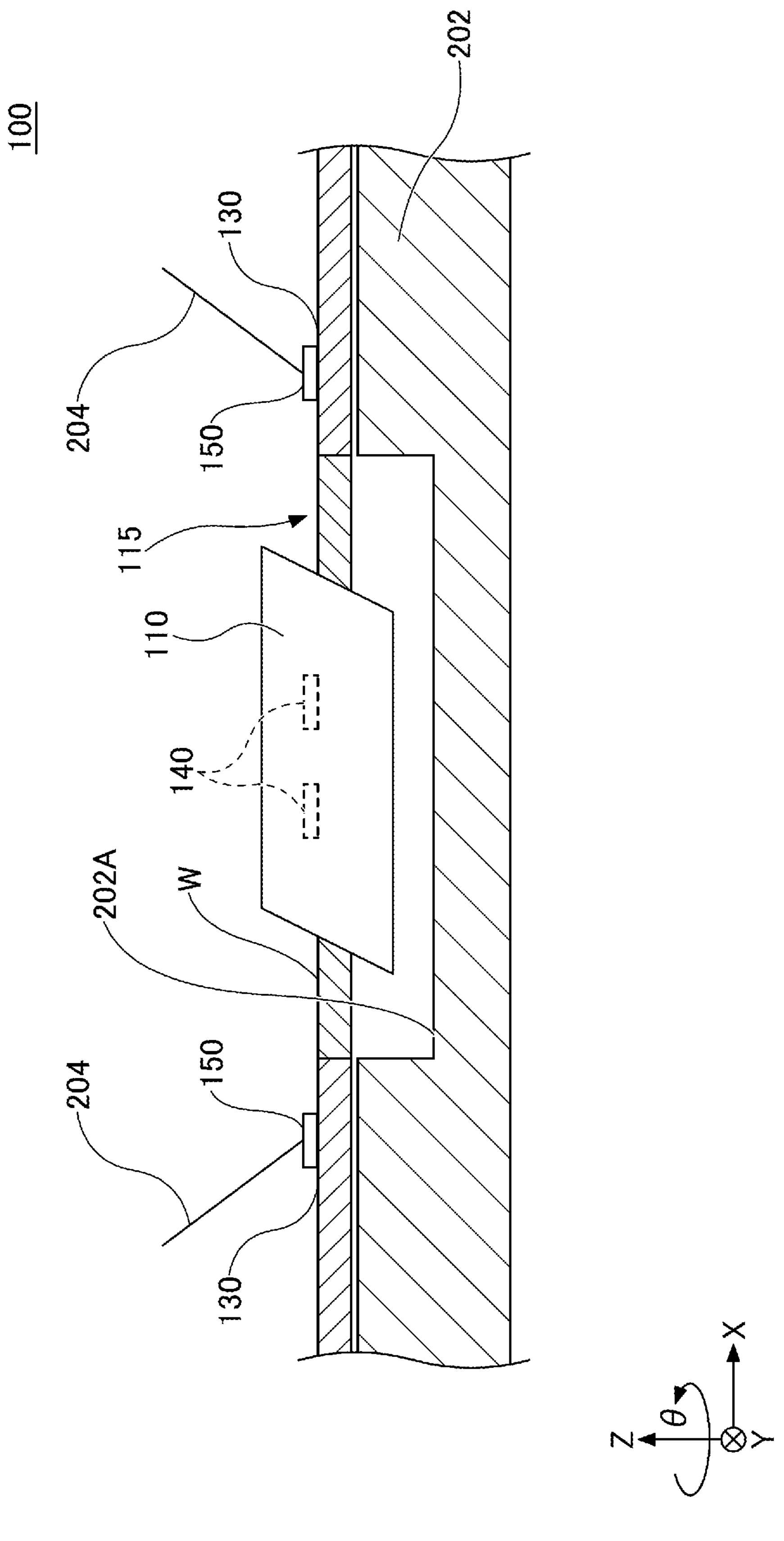
FIG. 3 is a partially enlarged view of the testing apparatus according to one embodiment.

Hereinafter, a method for testing the movable device 100 will be described. FIG. 2 is a partial cross-sectional view of a testing apparatus 200 according to the present embodiment. FIG. 3 is a partial enlarged view of the testing apparatus 200 according to the present embodiment.

The testing apparatus 200 is a prober that tests an object such as a wafer W. The movable device 100 such as a MEMS device is formed in the wafer W. The testing apparatus 200 includes a chuck 201, a tray 202, a probe card 203, and the like.

The chuck 201 is a mounting table that attracts the wafer W by applying a vacuum or the like to the wafer W. The chuck 201 is movable in the X-axis direction, the Y-axis direction, and the Z-axis direction, and is rotatable around a θ-axis, by an alignment apparatus that is provided below the chuck 201.

The tray 202 is placed on the upper surface of the chuck 201. The wafer W is placed on the tray 202. The tray 202 is a dedicated tray for a movable device 100.

As illustrated in FIG. 3, the tray 202 has a recess 202A under the movable portion 110 so as not to interfere with the operation of the movable portion 110.

Attracting holes, not illustrated, are provided at predetermined intervals in a circumferential direction of the tray 202. A circumferential portion of the wafer W is attached to the tray 202 by an attraction force that is applied by the chuck 201. However, an inner portion of the wafer W is not attached to the tray 202, because the through-holes 115 are provided around the movable portion 110.

A probe card 203 includes a plurality of testing probes 204 that are constituted by respective probe pins or the like. Each of the probes 204 extends downward from the lower surface of the probe card 203. The alignment apparatus causes each of the electrodes 140 of the movable device 100 and one or more probes 204 to contact one another.

Each probe 204 is coupled, at one end, to respective terminals of a test head that is provided above the probe card 203. Power and a test signal are supplied to the probe 204 via the test head. The testing apparatus 200 measures an output signal from the movable device 100, to electrically or mechanically check whether the movable device 100 operates normally.

In this description, the inner portion of the wafer W is not attached to the tray 202. In this case, during testing of the movable device 100, the support frame 130 of the movable device 100 may oscillate in accordance with the oscillations during operation.

Therefore, in the movable device 100 according to the present embodiment, the pseudo electrodes 150 are provided on the support frame 130 that surrounds the movable portion 110. In wafer testing of the movable device 100, each of the pseudo electrodes 150 is in contact with one or more probes 204, including the electrodes 140 each of which is in contact with one or more probes 240.

The pseudo electrode pads 151A to 158B are arranged symmetrically with respect to the center O of the support frame 130 in a plan view. With this arrangement, by bringing one or more probes 204 into contact with each of the pseudo electrodes 150, the pseudo electrodes 150 are fixed in place. Therefore, the support frame 130 can be further fixed in place during wafer testing of the movable device 100.

<Method for Fixing Movable Device>

Figure 4:
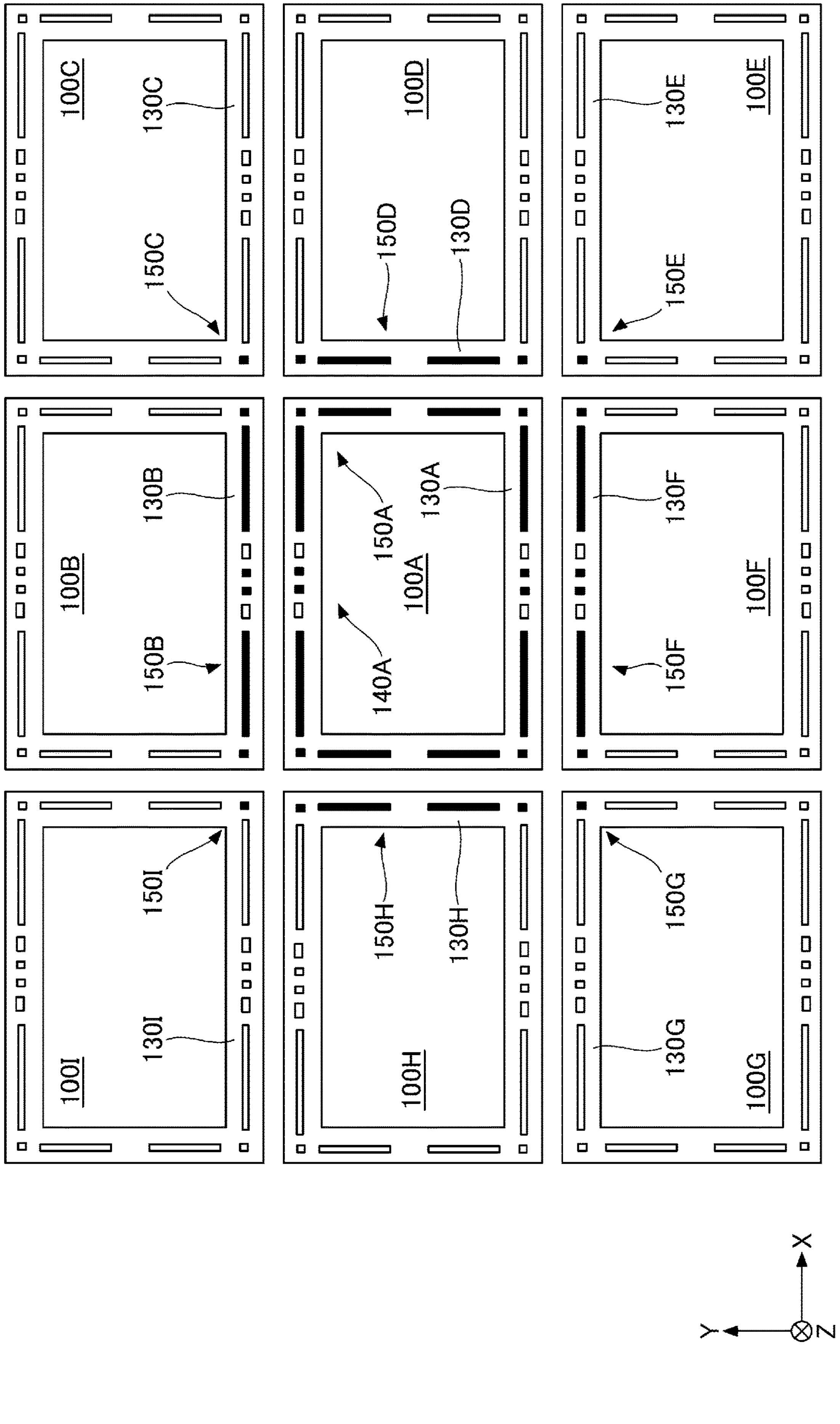
FIG. 4 is a diagram illustrating a method for fixing the movable device according to one embodiment.

Hereinafter, a method for fixing the movable device 100 will be described. FIG. 4 is a diagram illustrating the method for fixing the movable device 100 according to the present embodiment. FIG. 4 is a partially enlarged view of the wafer W, and illustrates nine movable devices 100A to 100I that are formed in the wafer W.

The movable device 100A that is a target to be tested is at a central portion of the wafer W. Eight movable devices 100B to 100I that are around the movable device 100A are movable devices that are not to be tested.

The movable devices 100B to 100I include four movable devices 100A, 100D, 100F, and 100H that are next to respective four sides of the movable device 100B, and includes four movable devices 100C, 100E, 100G, and 100I that are adjacent to respective four corners of the movable device 100A. The movable devices 100B to 100I are provided in proximity to the movable device 100A, and will be described below in detail.

When testing the movable device 100A, each of electrodes 140A and pseudo electrodes 150A of the movable device 100A comes into contact with one or more probes 204, and thus oscillations of a support frame 130A in the movable device 100A can be reduced.

In addition, pseudo electrodes 150B, 150C, 150D, 150E, 150F, 150G, 150H, and 150I of the respective movable devices 100B to 100I that are disposed around the movable device 100A may come into contact with any probes 204. With this arrangement, the support frame 130A in the movable device 100A can be further fixed in place.

When using movable devices 100B, 100D, 100F, and 100H, four frames among all frames in support frames 130B, 130D, 130F, and 130H are used. These four frames of the movable devices 100B, 100D, 100F, and 100H are next to the respective four sides of the movable device 100A, and the movable devices 100B, 100D, 100F, and 100H are each along a corresponding direction among the X-axis direction and the Y-axis direction (front-rear direction and left-right direction).

In addition, by bringing one or more probes 204 into contact with each of the pseudo electrodes 150B, 150D, 150F, and 150H that are provided on frames of the support frames 130B, 130D, 130F, and 130H, the support frame 130A of the movable device 100A can be further fixed in place.

When using movable devices 100C, 100E, 100G, and 100I, corresponding end portions among all end portions of support frames 130C, 130E, 130G, and 130I are used. These end portions of the support frames 130C, 130E, 130G, and 130I are disposed at the four corners of the movable device 100A. The movable devices 100C, 100E, 100G, and 100I are respectively next to an upper right portion, a lower right portion, an upper left portion, and a lower left portion of the movable device 100A.

By bringing one or more probes 204 into contact with each of pseudo electrodes 150C, 150E, 150G, and 150I that are provided at respective end portions of the support frames 130C, 130E, 130G, and 130I, the support frame 130A of the movable device 100A can be further fixed in place.

As described above, with use of the pseudo electrodes 150B to 150I of the movable devices 100B to 100I, not to be tested, that are around the movable device 100A, fluttering of the support frame 130A during operation of the target movable device 100A can be further reduced.

EXAMPLES

Figure 5:
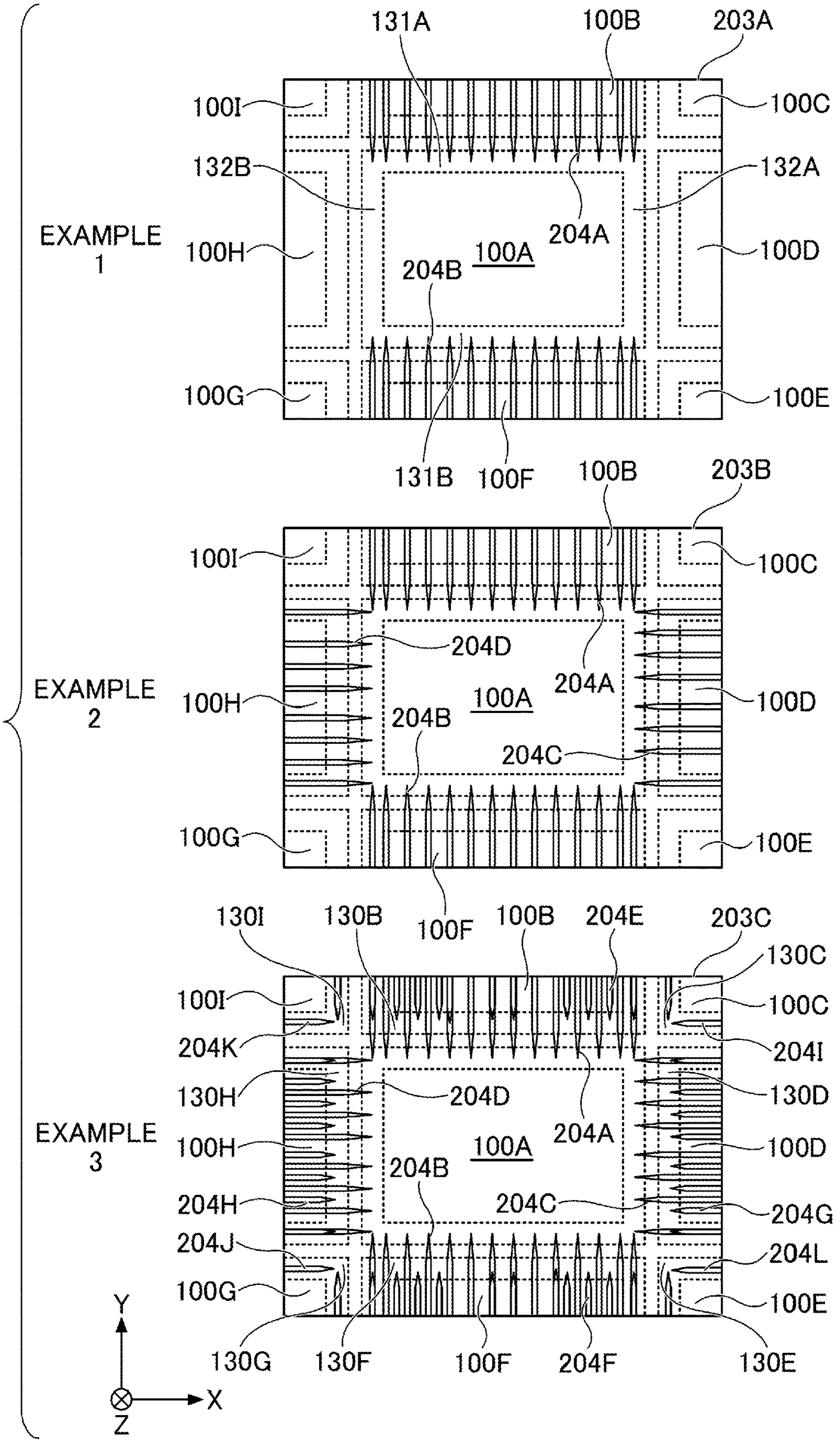
FIG. 5 is a diagram illustrating probes used to testing the movable device according to one embodiment.

Hereinafter, Examples of testing the movable device 100A will be described. FIG. 5 illustrates probes 204A to 204L used for testing the movable device 100A according to the present embodiment.

In Example 1, the movable device 100A is tested using a first probe card 203A. The first probe card 203A includes multiple first sets of probes 204A and 204B.

The respective probes 204A and 204B in each of the first sets are in contact with a given electrode 140 and a given pseudo electrode 150, and the given electrode 140 and the given pseudo electrode 150 are respectively provided on the first frame 131A and the second frame 131B facing the first frame 131A of the movable device 100A.

Two of the probes 204A are in contact with respective electrode pads 141A and 142A on the first frame 131A. Also, two of the probes 204B are in contact with respective electrode pads 141B and 142B on the second frame 131B. With this arrangement, a drive signal to drive a given movable portion is supplied to the movable device 100A.

Two of the probes 204A are in contact with the pseudo electrode pads 155A and 156A, respectively. The pseudo electrode pads 155A and 156A are at respective end portions of the first frame 131A. Two of the probes 204B are in contact with the pseudo electrode pads 155B and 156B, respectively. The pseudo electrode pads 155B and 156B are at respective end portions of the second frame 131B.

Two of the probes 204A are in contact with the respective pseudo electrode pads 157A and 158A that are on the first frame 131A. Two of the probes 204B are in contact with the respective pseudo electrode pads 157B and 158B that are on the second frame 131B.

Multiple probes 204A, e.g., four probes, are in contact with each of the pseudo electrode pads 151A and 152A of the first frame 131A. These four probes 204A are different from six probes 204A, namely two probes 204A in contact with the electrode pads 141A and 142A and four probes 204A in contact with the pseudo electrode pads 155A, 156A, 157A, and 158A. Also, multiple probes 204B, e.g., four probes, are in contact with each of the pseudo electrode pads 151B and 152B on the second frame 131B. These four probes 204B are different from six probes 204B, namely two probes 204B in contact with the electrode pads 141B and 142B and, four probes 204B in contact with the pseudo electrode pads 155B, 156B, 157B, and 158B.

With use of the four probes 204A in contact with the pseudo electrode pads 155A to 158A and, the four probes 204B in contact with the pseudo electrode pads 155B to 158B, the frames 131A and 131B are pressed, and thus oscillations of the movable device 100A are reduced.

In Example 1, in a case where the movable device 100A is in a wafer, the probes 204A and 204B in each of the first sets are each in contact with a corresponding electrode among the electrodes 140 and the pseudo electrodes 150 of the movable device 100A. Then, electrical or mechanical characteristics of the movable device 100A are inspected.

In Example 2, the movable device 100A is tested using a second probe card 203B. The second probe card 203B includes multiple second sets of probes 204C and 204D, in addition to including the above multiple first sets of probes 204A and 204B.

One or more of the probes 204C and 204D in the second sets are in contact with each of pseudo electrodes 150. Given electrodes of the pseudo electrodes 150 are provided on a corresponding frame among the third frame 132A and the fourth frame 132B facing the third frame 132A of the movable device 100A.

Two of the probes 204D are in contact with the respective pseudo electrode pads 155A and 156B. The pseudo electrode pads 155A and 156B are respectively at one end portion of the first frame 131A and one end portion of the second frame 131B. That is, the two probes 204D are at two end portions of the third frame 132A, respectively. Also, two of the probes 204C are in contact with the respective pseudo electrode pad 156A and 155B. The pseudo electrode pads 156A and 155B are respectively at one end portion of the first frame 131A and at one end portion of the second frame 131B. That is, the two probes 204C are at two end portions of the fourth frame 132B, respectively. Separately, the pseudo electrode pads 155A and 156A contact the respective probes 204A, and the pseudo electrode pads 155B and 156B contact the respective probes 204B. With this arrangement, each of the pseudo electrode pads 155A, 155B, 156A, and 156B contacts two probes.

Multiple probes 204D, e.g., three probes, are in contact with each of the pseudo electrode pads 153A and 154B on the third frame 132A. The three probes 204D are different from two probes 204D in contact with the pseudo electrode pads 155A and 156B. Also, multiple probes 204C, e.g., three probes, are in contact with each of the pseudo electrode pads 154A and 153B on the fourth frame 132B. The three probes 204C are different from two probes 204C in contact with the pseudo electrode pads 156A and 155B.

With use of the four probes 204A in contact with the pseudo electrode pads 155A to 158A and, the four probes 204B in contact with the pseudo electrode pads 155B to 158B, the frames 131A and 131B are pressed. In addition, with use of six probes 204C in contact with the pseudo electrode pads 154A and 153B and, six probes 204D in contact with the pseudo electrode pads 153A and 154B, the frames 132A and 132B are pressed. Thus, oscillations of the movable device 100A are reduced.

In Example 2, in a case where the movable device 100A is in a given wafer, probes 204A, 204B, 204C, and 204D in the first and second sets are each in contact with a given electrode among the electrodes 140 and the pseudo electrodes 150 of the movable device 100A. Then, electrical or mechanical characteristics of the movable device 100A are inspected.

In Example 3, the movable device 100A is tested using a third probe card 203C. The third probe card 203C includes third sets of probes 204E and 204F, fourth sets of probes 204G and 204H, fifth sets of probes 204I and 204J, and sixth sets of probes 204K and 204L, in addition to including the first sets of probes 204A and 204B and the second sets of probes 204C and 204D.

One or more among the probes 204E and 204F in the third sets are in contact with a corresponding electrode among the pseudo electrodes 150B and 150F. The pseudo electrodes 150B and 150F are provided for the movable devices 100B and 100F, respectively, and the movable devices 100B and 100F are next to the movable device 100A when viewed in the Y-axis direction (front-rear direction). The movable devices 100B and 100F are not to be tested.

One or more probes 204E are in contact with each pseudo electrode 150B that is provided on a support frame 130B of the movable device 100B, and the support frame 130B is next to the first frame 131A. Each probe 204E is between adjacent probes 204A in the X-axis direction.

One or more probes 204F are in contact with each pseudo electrode 150F that is provided on a support frame 130F of the movable device 100F, and the support frame 130F is next to the second frame 131B. Each probe 204F is between adjacent probes 204B in the X-axis direction.

One or more among the probes 204G and 204H in the fourth sets are in contact with a corresponding electrode among pseudo electrodes 150D and 150H in the movable devices 100D and 100H, and the movable devices 100D and 100H are next to the respective opposite sides of the movable device 100A in the X-axis direction (left-right direction). The movable devices 100D and 100H are not to be tested.

One or more probes 204H are in contact with each pseudo electrode 150H that is provided on a support frame 130H of a movable device 100H, and the frame 130H is next to the third frame 132A. Each probe 204H is between adjacent probes 204D in the Y-axis direction.

One or more probes 204G are in contact with each pseudo electrode 150D that is provided on a support frame 130D of the movable device 100D, and the support frame 130D is next to the fourth frame 132B. Each probe 204G is between adjacent probes 204C in the Y-axis direction.

One or more among the probes 204I and 204J in the fifth sets are in contact with a corresponding electrode among pseudo electrodes 150C and 150G in the movable devices 100C and 100G, and the movable devices 100C and 100G are next to respective two corners of the movable device 100A when viewed in a first diagonal direction. The movable devices 100C and 100G are not to be tested.

One or more among probes 204K and 204L in the sixth sets are in contact with a corresponding electrode among pseudo electrodes 150E and 150I of the movable devices 100E and 100I, and the movable devices 100E and 100I are next to the respective remaining two corners of the movable device 100A when viewed in a second diagonal direction. The movable devices 100E and 100I are not to be tested.

The number of probes 204 in contact with any pseudo electrodes 150 is not limited to the number described above, and can be appropriately selected. For example, in the above description, a plurality of probes contact the pseudo electrodes 150, but one probe may contact the pseudo electrodes 150, or a greater number of probes may contact the pseudo electrodes 150.

In Example 3, in a case where the movable device 100A is in a given wafer, the probes 204A to 204L in the first to sixth sets are each in contact with a corresponding electrode among the electrodes 140 and the pseudo electrodes 150 of the movable device 100A and, the pseudo electrodes 150 of the other movable devices 100B to 100I that are not tested. Then, electrical or mechanical characteristics of the movable device 100A are inspected.

In addition, in order to confirm the effect of wafer testing of the movable device 100A in Examples 1 to 3, a reference example and a comparative example are used.

In the reference example, a movable device without using any pseudo electrode pads 151A to 158B is assembled into a package. In the reference example, in a case where the movable device is assembled in the package, one or more testing-dedicated sockets are attached to electrodes 140 of the movable device, and then electrical or mechanical characteristics of the movable device are inspected.

In the comparative example, a movable device without using any pseudo electrode pads 151A to 158B is used. In the comparative example, in a case where the movable device is in the given wafer, one or more probes 204 are brought into contact with only the electrodes 140 of the movable device, and then electrical or mechanical characteristics of the movable device are inspected.

Figure 6:
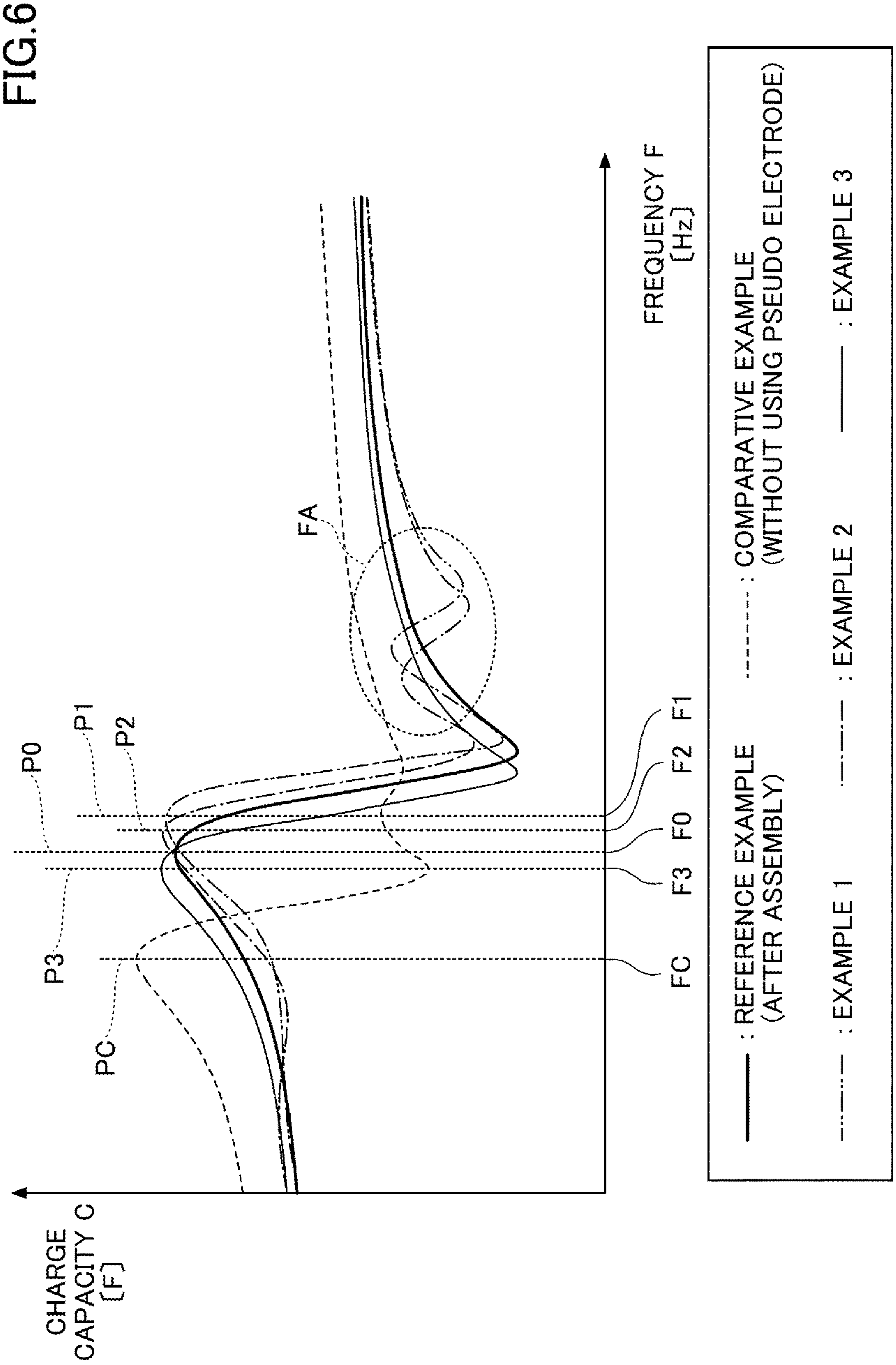
FIG. 6 is a diagram illustrating testing results of the movable device in a reference example, a comparative example, and Examples.

FIG. 6 is a diagram illustrating testing results of the movable device in the reference example, the comparative example, and Examples 1 to 3. FIG. 6 illustrates the relationship between the frequency F (Hz) of the drive voltage that is applied to each of drive sources 122A and 122B and, charge capacity C (F) of each of the drive sources 122A and 122B.

FIG. 6 indicates that the drive beams 121A and 121B oscillate significantly at frequencies F at which the charge capacity C becomes large, to move in the Z-axis direction (vertical direction).

In the testing result of the reference example as indicated by the thick solid line, the result is obtained after assembling the movable device into the package. The obtained values are defined as reference values.

In the comparative example, the testing result as indicated by the broken line shows that a frequency FC corresponding to a peak value PC of the charge capacity C deviates significantly from a frequency P0 corresponding to a peak value F0 of the charge capacity C.

In the comparative example, the curve for the testing result significantly differs from the curve for the testing result in the reference example. From this situation, in the comparative example for wafer testing of the movable device, it has been seen that the testing result deviates greatly from the reference values described above.

In Example 1, the testing result as indicated by the two-dot chain line shows that a frequency P1 corresponding to a peak value F1 of the charge capacity C becomes close to the frequency P0 corresponding to the peak values F0 of the charge capacity C in the reference example.

As indicated by a box FA, in Example 1, the charge capacity C changes greatly in a high frequency range. From this situation, in Example 1 for wafer testing of the movable device 100A, it has been seen that the testing result becomes close to the reference values.

In Example 2, the testing result as indicated by the chain line shows that a frequency P2 corresponding to the peak values F2 of the charge capacity C becomes closer to the frequency P0 corresponding to the peak values F0 of the charge capacity C in the reference example.

As indicated by the box FA, in Example 2, smaller changes in the charge capacity C in the high frequency range are obtained. From this situation, In Example 2 for wafer testing of the movable device 100A, it has been seen that the testing result is closer to the reference values.

In Example 3, the testing result as indicated by the solid line shows that a frequency P3 corresponding to a peak values F3 of the charge capacity C is the closest frequency to the frequency P0 corresponding to the peak value F0 of the charge capacity C in the reference example.

The curve relating to the charge capacity C in Example 3 is the closest curve to the curve relating the charge capacity C in the reference example. From this situation, in Example 3 for wafer testing of the movable device 100A, it has been seen that the test result substantially corresponds to the reference values.

<Effect of Present Embodiment>

The movable device 100 according to the present embodiment includes the pseudo electrodes 150 on the support frame 130 that surrounds the movable portion 110 and supports the drive portion 120. The pseudo electrodes 150 are arranged symmetrically with respect to the center O of the support frame 130 in the plan view.

In the wafer testing of the movable device 100, it has been found that the values of the test result are close to or equal to the reference values. That is, it has been found that each pseudo electrode 150 is bought into contact with one or more probes 204, and thus fluttering of the support frame 130 due to oscillations during operation of the movable device 100 can be reduced.

As a result, electrical or mechanical characteristics of the movable device 100 can be inspected during wafer testing, without performing inspection after assembling the movable device 100 into a package. Thus, testing hours, the number of components and the like can be reduced in comparison to a case where the movable device 100 is tested after assembly.

With this arrangement, in the movable device 100 according to the present embodiment, efficient testing of the movable device can be provided.

<Optical Scanning Apparatus>

Figure 7:
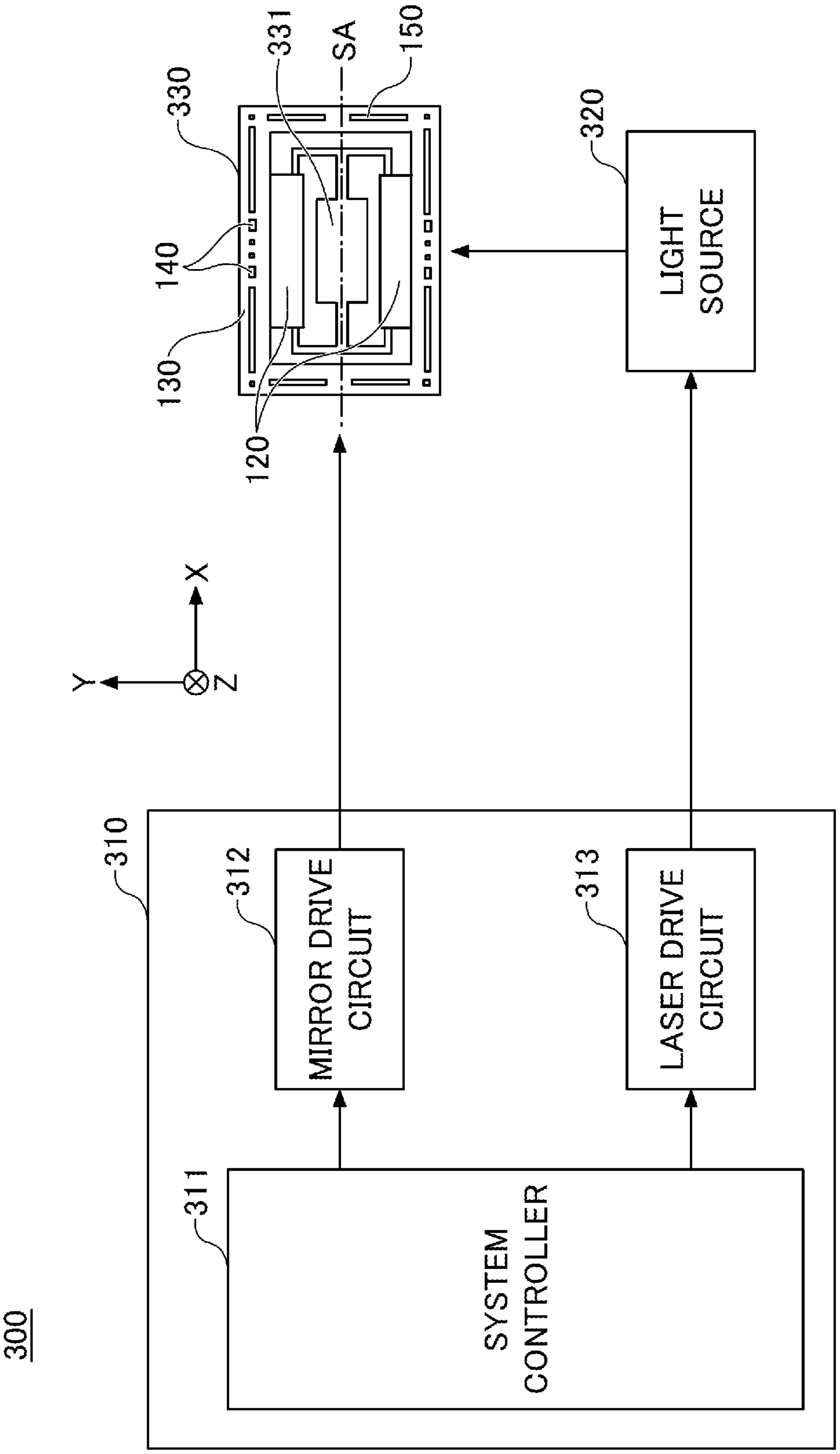
FIG. 7 is a diagram illustrating a configuration example of an optical scanning apparatus with the movable device according to one embodiment.

Hereinafter, an optical scanning apparatus using the movable device 100 will be described. FIG. 7 is a diagram illustrating a configuration example of an optical scanning apparatus 300 using the movable device 100.

The optical scanning apparatus 300 is, for example, a light detection and ranging (LiDAR). The optical scanning apparatus 300 includes an optical scanning controller 310, a light source 320, and an optical scanner 330.

The optical scanning controller 310 is a drive controller that drives and controls each of the light source 320 and the optical scanner 330. The optical scanning controller 310 includes a system controller 311, a mirror drive circuit 312, and a laser drive circuit 313.

The light source 320 is a light source that includes a laser diode or the like.

The optical scanner 330 is an optical scanner structure that includes the movable device 100 such as a MEMS mirror. The optical scanner 330 includes a mirror 331, a drive portion 120, the support frame 130, the electrodes 140, and the pseudo electrodes 150.

The system controller 311 supplies a control signal to control the oscillation of the mirror 331 in the optical scanner 330, to the mirror drive circuit 312. The system controller 311 also supplies a timing signal with which laser light emits, to the laser drive circuit 313.

The system controller 311 includes a central processing unit (CPU), a read only memory (ROM), and a random access memory (RAM). The system controller 311 further includes a non-volatile random access memory (NVRAM).

The CPU controls the entire system controller 311, and executes various arithmetic processing. The ROM stores a program used for driving the CPU, such as an initial program loader (IPL). The RAM is used as a storage area where a program is loaded, or as a work area for the loaded program. The NVRAM stores various programs that the CPU executes.

In response to receiving a control signal from the system controller 311, the mirror drive circuit 312 supplies a mirror drive signal to oscillate the mirror 331 about the rotation axis SA, to the optical scanner 330.

In response to receiving the timing signal that is supplied by the system controller 311, the laser drive circuit 313 supplies a laser drive signal to drive a laser diode, to the light source 320.

In response to receiving the laser drive signal supplied by the laser drive circuit 313, the light source 320 intermittently emits laser light at a timing that is defined by the timing signal. The laser light emitted by the light source 320 is incident on the mirror 331 of the optical scanner 330.

The mirror 331 is a mirror body that is driven by the drive portion 120 based on the mirror drive signal supplied by the mirror drive circuit 312.

The drive portion 120 is a drive source that drives the mirror 331 based on the mirror drive signal supplied by the mirror drive circuit 312.

The support frame 130 surrounds the mirror 331, and supports the drive portion 120.

The electrodes 140 are conductors that are electrically coupled to the drive portion 120. The pseudo electrodes 150 are pseudo conductors that are electrically isolated from the drive portion 120.

The electrodes 140 and the pseudo electrodes 150 are provided on the support frame 130, and the pseudo electrodes 150 are arranged symmetrically with respect to the center of the support frame 130, in a plan view.

By bringing one or more probes 204 into contact with each pseudo electrodes 150 during wafer testing of the movable device 100, the optical scanner 330 can reduce fluttering of the support frame 130 due to oscillations during operation.

The electrical or mechanical characteristics of the movable device 100 can be inspected during wafer testing. That is, in a state where the optical scanner 330 is obtained by assembling the movable device 100 into a given package, testing is not performed. With this approach, testing hours, the number of components and the like can be reduced in comparison to a case where the movable device 100 is tested after assembly.

What is claimed is:

1. A movable device comprising:

a movable portion;

a drive structure configured to drive the movable portion;

a support frame that surrounds the movable portion and supports the drive structure;

electrodes electrically coupled to the drive structure;

pseudo electrodes electrically isolated from the drive structure, wherein the electrodes and the pseudo electrodes are provided on the support frame, and wherein all of the pseudo electrodes are fixed in contact with at least one testing probe.

2. The movable device according to claim 1, wherein the pseudo electrodes are arranged symmetrically with respect to a center of the support frame in a plan view.

3. The movable device according to claim 1, wherein the support frame is rectangular in a plan view, and includes a first frame and a second frame facing the first frame, the first frame and second frame defining opposing sides of the support frame, and wherein one or more of the pseudo electrodes are provided on each of the first frame and the second frame.

4. The movable device according to claim 1, wherein the support frame is rectangular in a plan view, and includes a first frame and a second frame facing the first frame, the first frame and second frame defining opposing sides of the support frame, wherein the drive structure is supported by the first frame and the second frame, and wherein one or more of the pseudo electrodes are provided on each of the first frame and the second frame.

5. The movable device according to claim 1, wherein the support frame is rectangular in a plan view, and includes a plurality of frames defining four sides of the support frame, and wherein one or more of the pseudo electrodes are provided on a corresponding frame among the plurality of frames.

6. The movable device according to claim 1, wherein the support frame is rectangular in a plan view, and includes a plurality of frames defining four sides of the support frame, and wherein one or more of the pseudo electrodes are provided at a corner of the support frame that is formed at a junction between end portions of adjacent frames among the plurality of frames.

7. The movable device according to claim 1, wherein the support frame is rectangular in a plan view, and includes a first frame and a second frame facing the first frame, the first frame and second frame defining opposing sides of the support frame, and wherein one or more of the pseudo electrodes are provided at a middle portion of each of the first frame and the second frame.

8. The movable device according to claim 1, wherein each of the pseudo electrodes has a linear shape or a dot shape.

9. The movable device according to claim 1, wherein the electrodes are arranged symmetrically with respect to a center of the support frame, in a plan view.

10. The movable device according to claim 1, wherein the at least one testing probe includes a plurality of testing probes, and wherein one or more of the pseudo electrodes are configured to be fixed to the support frame, while bringing the one or more pseudo electrodes into contact with corresponding testing probes, among the plurality of testing probes, in a second movable device that is next to the movable device.

11. An optical scanning apparatus comprising:

the movable device of claim 1.

12. A microelectromechanical systems (MEMS) device comprising:

a movable portion;

a drive structure configured to drive the movable portion;

a support frame that surrounds the movable portion and supports the drive structure;

electrodes electrically coupled to the drive structure; and pseudo electrodes electrically isolated from the drive structure, wherein the electrodes and the pseudo electrodes are provided on the support frame, and wherein all of the pseudo electrodes are fixed in contact with at least one testing probe.

13. The MEMS device according to claim 12, wherein the pseudo electrodes are arranged symmetrically with respect to a center of the support frame in a plan view.

14. The MEMS device according to claim 12, wherein the support frame is rectangular in a plan view, and includes a first frame and a second frame facing the first frame, the first frame and second frame defining opposing sides of the support frame, respectively, wherein the drive structure is supported by the first frame and the second frame, and wherein one or more of the pseudo electrodes are provided on each of the first frame and the second frame.

15. An optical scanning apparatus comprising: the MEMS device of claim 12.

* * * * *